US 12,046,822 B2

(12) United States Patent
Ulbricht et al.

(10) Patent No.: US 12,046,822 B2
(45) Date of Patent: Jul. 23, 2024

(54) PARTICIPANT OF A COMMUNICATION SYSTEM WITH A MAGNETIC ANTENNA

(71) Applicant: Fraunhofer-Gesellschaft zur Förderung der angewandten Forschung e.V., Munich (DE)

(72) Inventors: Gerald Ulbricht, Erlangen (DE); Albert Heuberger, Erlangen (DE); Gerd Kilian, Erlangen (DE); Ralph Oppelt, Erlangen (DE)

(73) Assignee: Fraunhofer-Gesellschaft zur Foerderung der angewandten Forschung e. V., Munich (DE)

( * ) Notice: Subject to any disclaimer, the term of this patent is extended or adjusted under 35 U.S.C. 154(b) by 187 days.

(21) Appl. No.: 17/387,152

(22) Filed: Jul. 28, 2021

(65) Prior Publication Data
US 2021/0359425 A1 Nov. 18, 2021

Related U.S. Application Data

(63) Continuation of application No. PCT/EP2020/052130, filed on Jan. 29, 2020.

(30) Foreign Application Priority Data

Jan. 31, 2019 (DE) .......... 102019201262.0

(51) Int. Cl.
*H04B 1/00* (2006.01)
*H01Q 7/00* (2006.01)
(Continued)

(52) U.S. Cl.
CPC .......... *H01Q 21/20* (2013.01); *H01Q 7/00* (2013.01); *H04B 1/7136* (2013.01)

(58) Field of Classification Search
CPC .......... H01Q 7/005; H01Q 1/38; H01Q 21/20; H01Q 7/00; G01R 33/34007;
(Continued)

(56) References Cited

U.S. PATENT DOCUMENTS 5,142,292 A 8/1992 Chang
5,225,847 A * 7/1993 Roberts .......... H01Q 7/005
343/745
(Continued)

FOREIGN PATENT DOCUMENTS

CN 1781320 A 5/2006
CN 1852764 A 10/2006
(Continued)

OTHER PUBLICATIONS

Popeye, Home Made—High Power Magnetic Loop Antennas—https://amrron.com/2015/07/24/home-made-high-power-magnetic-loop-antennas/, Jul. 24, 2015.
(Continued)

*Primary Examiner* — Khai Tran
(74) *Attorney, Agent, or Firm* — Perkins Coie LLP

(57) ABSTRACT

Embodiments of the present invention provide a participant of a wireless communication system, wherein the participant includes a transmission and/or reception unit and an antenna array connected to the transmission and/or reception means, wherein the antenna array includes a magnetic antenna with a loop discontinued once or multiple times.

20 Claims, 10 Drawing Sheets

(51) Int. Cl.
*H01Q 21/20* (2006.01)
*H04B 1/7136* (2011.01)

(58) Field of Classification Search
CPC ...... G01R 33/341; G01R 5/0081; H04B 1/38; H04B 1/7136; H04B 5/0031
USPC .................................. 375/133, 260, 262, 267
See application file for complete search history.

(56) References Cited

U.S. PATENT DOCUMENTS

| | | | |
|---|---|---|---|
| 9,354,081 | B2 | 5/2016 | Bernhard et al. |
| 2004/0033794 | A1 | 2/2004 | Korden et al. |
| 2004/0214621 | A1 | 10/2004 | Ponce et al. |
| 2007/0146210 | A1 | 6/2007 | Hilgers |
| 2008/0048867 | A1 | 2/2008 | Oliver et al. |
| 2009/0315792 | A1 | 12/2009 | Miyashita et al. |
| 2010/0231472 | A1 | 9/2010 | Tran |
| 2010/0253587 | A1* | 10/2010 | Lindenmeier .......... H01Q 21/29 343/858 |
| 2012/0241524 | A1 | 9/2012 | Blot et al. |
| 2013/0016018 | A1* | 1/2013 | Ham ...................... H01Q 7/005 343/703 |
| 2015/0155737 | A1 | 6/2015 | Mayo |
| 2016/0065295 | A1 | 3/2016 | Stanescu et al. |
| 2017/0025767 | A1 | 1/2017 | Elsallal et al. |
| 2017/0244157 | A1 | 8/2017 | Muehlbauer et al. |
| 2019/0190550 | A1* | 6/2019 | Williams ............. G06Q 10/087 |
| 2021/0266019 | A1* | 8/2021 | Perri .................... H04B 1/0343 |
| 2022/0013910 | A1* | 1/2022 | Kilian ................... H01Q 7/005 |

FOREIGN PATENT DOCUMENTS

| | | |
|---|---|---|
| CN | 1922759 A | 2/2007 |
| CN | 101501928 A | 8/2009 |
| CN | 101536254 A | 9/2009 |
| CN | 102349190 A | 2/2012 |
| CN | 102906766 A | 1/2013 |
| CN | 203260740 U | 10/2013 |
| CN | 104067136 A | 9/2014 |
| CN | 104752810 A | 7/2015 |
| CN | 105119696 A | 12/2015 |
| CN | 105745810 A | 7/2016 |
| DE | 102009011542 A1 | 9/2010 |
| DE | 102011082098 B4 | 3/2013 |
| EP | 2991239 A1 | 3/2016 |
| EP | 3208886 A1 | 8/2017 |
| JP | 2010166503 A | 7/2010 |
| JP | 2010233124 A | 10/2010 |
| JP | 2011193245 A | 9/2011 |
| KR | 101797563 B1 | 11/2017 |
| WO | 2004095626 A2 | 11/2004 |
| WO | 2009045210 A1 | 4/2009 |
| WO | 2010105273 A1 | 9/2010 |
| WO | 2013108142 A1 | 7/2013 |

OTHER PUBLICATIONS

Dobkin, D.M., et al., "Segmented magnetic antennas for near-field UHF RFID", Microwave Journal, Euro—Global Edition—Jun. 2007—Horizon House Publications Inc.—USA, (Jun. 30, 2007), vol. 50, No. 6, pp. 96-102, XP002798177.

Naishadham, K., et al., "Antenna design strategies to reduce coupling and interference in wireless communications systems", Radio and Wireless Symposium (RWS), 2013 IEEE, IEEE, (Jan. 20, 2013), doi:10.1109/RWS.2013.6486641, ISBN 978-1-4673-2929-3, pp. 61-63, XP032351301.

Oppelt, R., Deaktivierung resonanter Loops—2018.

Qing, X., et al., "UHF near-field RFID reader antenna with capacitive couplers", Electronic Letters, the Institution of Engineering and Technology, (Nov. 25, 2010), vol. 46, No. 24, doi:10.1049/EL:20102762, ISSN 1350-911X, pp. 1591-1592, XP006037122.

Qing, X., et al., "UHF near-field segmented loop antennas with enlarged interrogation zone", 2012 IEEE International Workshop on Antenna Technology (IWAT), (Mar. 1, 2012), doi:10.1109/IWAT. 2012.6178416, ISBN 978-1-4673-0035-3, pp. 132-135, XP055572059.

Roemer, P.B., "The NMR phased array", Abstract, https://onlinelibrary.wiley.com/doi/pdf/10.1002/mrm.1910160203, Nov. 1990.

Steiner, G., et al., "A Tuning Transformer for the Automatic Adjustment of Resonant Loop Antennas in RFID", Industrial Technology, 2004. IEEE ICIT '04. 2004 IEEE International Conference on Hammamet, Tunisia, Dec. 8-10, 2004, XP10822161.

Biot-Savart law, https://en.wikipedia.org/wiki/Biot%E2%80%93Savart_law; retrieved from the Internet Aug. 20, 2021.

Electromagnetic induction, https://en.wikipedia.org/wiki/Electromagnetic_induction; retrieved from the Internet Aug. 20, 2021.

How to: Build a RF Resonator Surface Coil, http://bio.groups.et.byu.net/SurfaceCoil_build.phtml, BYU, Dept. of Electrical & Computer Engineering; 1994-2010.

Yates, S., "AA5TB—Small Loop Antenna", http://www.aa5tb.com/loop.html; retrieved from the Internet Aug. 20, 2021.

Schwarz R. T. "On the prospects of MIMO SatCom systems: The tradeoff between capacity and practical effort", 2009 6th International Multi-Conference on Systems, Signals and Devices.

\* cited by examiner

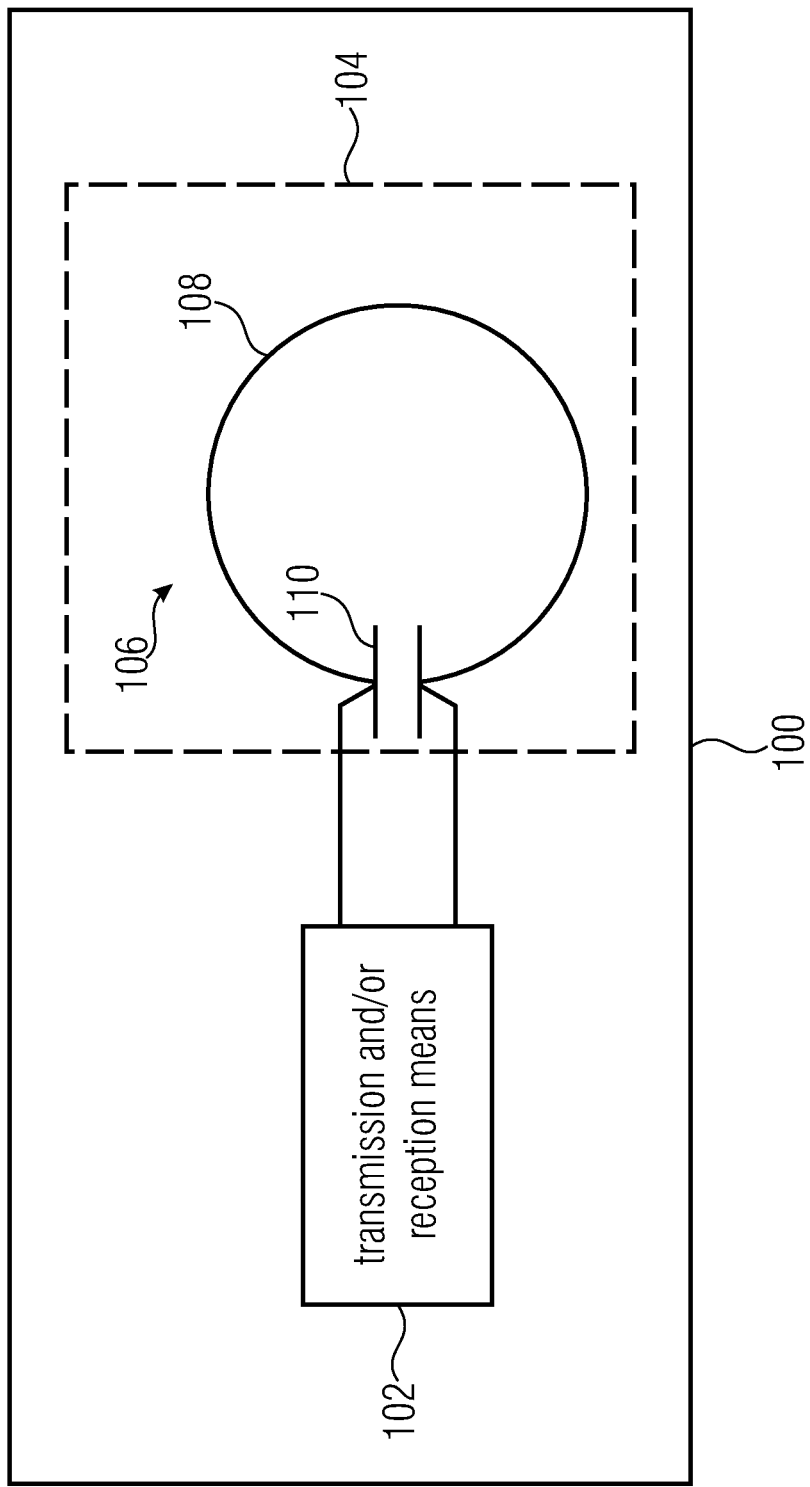

PARTICIPANT OF A COMMUNICATION SYSTEM WITH A MAGNETIC ANTENNA

CROSS-REFERENCES TO RELATED APPLICATIONS

This application is a continuation of copending International Application No. PCT/EP2020/052130, filed Jan. 29, 2020, which is incorporated herein by reference in its entirety, and additionally claims priority from German Application No. DE 10 2019 201 262.0, filed Jan. 31, 2019, which is incorporated herein by reference in its entirety.

Embodiments of the present invention relate to a participant of a communication system and in particular to a participant with a magnetic antenna. Further embodiments relate to a terminal point and a base station with a magnetic antenna. Some embodiments relate to an implementation of a magnetic loop.

BACKGROUND OF THE INVENTION

Electric antennas, or electrically short antennas, are conventionally used, particularly in the field of sensor nodes. For example, when using a currently conventional electric antenna at 868 MHz, a length of approximately 15 cm is a requirement as a ½ lambda radiator. When using shorter antennas, the gain of the antenna decreases. Furthermore, the handling capability of the devices with antennas is limited since the antennas used are detuned when approaching electrically conductive or dielectrically effective elements, and their gain therefore decreases further. In addition, with electric antennas, it is not possible to transmit out of shielded environments (Faraday cage).

Furthermore, magnetic antennas are known [1]. However, due to their high quality factor (Q factor), magnetic antennas have narrow-band characteristics. Thus, for example, magnetic antennas have to be tuned to the desired frequency when approaching metal or dielectric elements. In this case, it is possible to tune the magnetic antenna by hand or to operate it in a self-tuning manner.

FIG. 1a shows a schematic view of a magnetic antenna 10 tunable by hand through a rotary capacitor 12, while FIG. 1b shows an electric equivalent circuit diagram, and FIG. 1c shows an antenna diagram of the magnetic antenna 10 [2].

The magnetic antenna 10 includes a primary coupling loop 14 fed via a 50 ohms coaxial cable 18 and a secondary resonant loop 16. The circumference of the secondary resonant loop 16 is usually less than 1/10 of the wavelength, while the primary coupling loop 14 usually comprises ⅕ of the size of the secondary resonant loop 16.

In the field of amateur radio, tuning by hand is common. However, in sensor nodes, self-tuning is desirable in favor of a simple handling capability.

In order to keep the tuning range as small as possible, the magnetic loop may be shortened multiple times, as is common in magnetic resonance tomography (MR) [3], [4].

In MR, only the magnetic field adds to the desired effect, hence the name "magnetic resonance", while electric field portions are highly undesired since they enter into the patient and there, due to the dielectric loss of the body tissue:
a) in the transmission case, unnecessarily heat up the patient, and
b) in the reception case, lower the Q factor of the loops, which means that the signal-noise ratio (S/N) becomes worse. Often times, the expression "more noise is coupled in" is used. However, in physical terms this is not correct since the operation temperature of the loop remains the same regardless of the degree of shortening. The effect is that, due to the lower Q factor (i.e. the lower resonance rise), the use signal is weakened, resulting in a worse signal-noise ratio (S/N).

The proportion of the electric fields essentially depends on the wire length of the coil/loop compared to the wavelength. That is, the electric field is created longitudinally of the conductor towards the resonance capacity, as is shown in FIG. 2.

FIG. 2 shows a schematic view of a loop 22 of a magnetic antenna 20, wherein the electric field 24 longitudinally along the conductor of the loop 22 towards the resonance capacity 26.

Thus, MR local antennas are almost always implemented as single-turn loops. More than one turn is used only at very low frequencies, since, due to the extremely bad LC conditions, the operation Q factor would suffer more due to the bad self-Q factor than the electric field portions would cause in the operation at the patient. At increasing frequencies, the single turn of the loop is already too long compared to the wavelength, wherein the loop size cannot be arbitrarily decreased since it has to be adapted to be body region of the patient to be examined. Thus, this one turn is divided by several resonance capacities (capacitively shortened multiple times).

SUMMARY

An embodiment may have a participant of a wireless communication system, wherein the participant comprises a transmission and/or reception means (or unit, or device) and an antenna array connected to the transmission and/or reception means, wherein the antenna array comprises a magnetic antenna with a loop discontinued multiple times; wherein the participant is configured to transmit signals to other participants of the communication system by means of the magnetic antenna, and/or to receive signals from other participants of the communication system by means of the magnetic antenna, wherein the wireless communication system is a low power wide area network, LPWAN.

Another embodiment may have a participant of a wireless communication system, wherein the participant comprises a transmission and/or reception means (or unit, or device) and an antenna array connected to the transmission and/or reception means, wherein the antenna array comprises a magnetic antenna with a loop discontinued once or multiple times, wherein the magnetic antenna is a first magnetic antenna, wherein the antenna array further comprises a second magnetic antenna, wherein the loop discontinued once or multiple times of the first magnetic antenna and a loop of the second magnetic antenna are arranged essentially orthogonal to each other, wherein the participant is configured to deactivate one of the magnetic antennas of the antenna array to vary a radiation characteristic of the antenna array.

Another embodiment may have a participant of a wireless communication system, wherein the participant comprises a transmission and/or reception means (or unit, or device) and an antenna array connected to the transmission and/or reception means, wherein the antenna array comprises a magnetic antenna with a loop discontinued once or multiple times, wherein the magnetic antenna is a first magnetic antenna, wherein the antenna array further comprises a second magnetic antenna, wherein the loop discontinued once or multiple times of the first magnetic antenna and a loop of the second magnetic antenna are arranged essentially orthogonal to each other, wherein a participant is configured to vary an emission ratio of the antenna array by detuning the self-resonance of at least one of the two magnetic antennas.

Embodiments provide a participant of a wireless communication system, wherein the participant comprises a transmission and/or reception means [e.g. a transmitter, receiver or transceiver] and an antenna array connected to the transmission and/or reception means, wherein the antenna array comprises a magnetic antenna with a loop [e.g. a current loop] discontinued [divided] once or multiple times [e.g. at least twice].

In embodiments, the loop may be discontinued [e.g. divided] by one or several capacity elements [e.g. capacitors, capacity diodes].

For example, the loop of the magnetic antenna may be discontinued [e.g. at least twice] by at least two capacity elements.

In embodiments, the loop discontinued multiple times may be discontinued [e.g. divided] into at least two segments by the capacity elements.

For example, the loop may be divided into n segments by n capacity elements, wherein n is a natural number larger than or equal to two.

In embodiments, the at least two segments of the loop discontinued multiple times may be connected by the capacity elements.

For example, the at least two segments of the loop discontinued multiple times and the at least two capacity elements may be connected in series. In other words, two segments of the loop discontinued multiple times each may be connected by one capacity element connected in series between the two segments.

In embodiments, the loop discontinued once or multiple times [e.g. the at least two segments of the loop] and the capacity elements may form a resonant circuit.

In embodiments, the loop may form a coil.

In embodiments, the transmission and/or reception means may be connected to the magnetic antenna via one of the capacity elements [e.g. wherein the one capacity element and the loop discontinued once or multiple times form a parallel resonant circuit [e.g. with the other capacity elements]].

In embodiments, the loop may be ring-shaped or m-polygonal, wherein m is a natural number larger than or equal to four.

For example, the loop may be quadrangular, pentagonal, hexagonal, heptagonal, octagonal, nonagonal, decagonal, hendecagonal, dodecagonal, and so on.

In embodiments, the magnetic antenna may be implemented [e.g. realized] on a circuit board.

In embodiments, the antenna array may comprise a tuning circuit for tuning the magnetic antenna.

In embodiments, the tuning circuit and the magnetic antenna may be implemented on the same circuit board.

In embodiments, the magnetic antenna may be a first magnetic antenna, wherein the antenna array may further comprise a second magnetic antenna, wherein the loop discontinued multiple times of the first antenna and a loop of the second antenna may be arranged essentially orthogonal to each other.

In embodiments, a first area spanned by the loop discontinued once or multiple times of the first magnetic antenna and a second area spanned by the loop of the second magnetic antenna may be orthogonal to each other.

For example, a main emission direction/main reception direction of the first magnetic antenna and a main emission direction/main reception direction of the second magnetic antenna may be orthogonal to each other.

For example, a null of the first magnetic antenna and a null of the second magnetic antenna may be different.

In embodiments, an area spanned by the loop of the second magnetic antenna may be smaller than an area spanned by the loop of the first magnetic antenna by the factor two [e.g. the factor three, four, five or ten].

For example, the loop of the second antenna may be "flattened".

In embodiments, the loop of the second antenna may be implemented to be not round so as to adapt to a shape of the housing of the participant.

For example, the loop of the second magnetic antenna may be essentially rectangular.

In embodiments, the first magnetic antenna and the second magnetic antenna may be arranged adjacent to each other.

In embodiments, a conductor of the loop of the second magnetic antenna may be thicker or broader than a conductor of the loop of the first antenna at least by the factor two [e.g. by the factor three, four, or five].

In embodiments, the loop of the second antenna may be discontinued multiple times.

For example, the loop of the second magnetic antenna may be discontinued [at least twice] by at least two capacity elements.

In embodiments, the participant may be configured to deactivate one of the magnetic antennas of the antenna array [e.g. the first magnetic antenna or the second magnetic antenna] so as to vary a radiation characteristic [e.g. emission direction or reception direction; e.g. main lobe] of the antenna array.

For example, the participant may be configured to vary a radiation characteristic [e.g. emission direction or reception direction; e.g. main lobe] of the antenna array by deactivating one of the magnetic antennas of the antenna array [e.g. the first magnetic antenna or the second magnetic antenna].

In embodiments, one of the magnetic antennas of the antenna array may be deactivated by detuning the respective magnetic antenna [e.g. the first magnetic antenna or the second magnetic antenna].

In embodiments, one of the magnetic antennas of the antenna array may be deactivated by connecting in parallel a coil to one of the capacity elements of the loop or the respective magnetic antenna [e.g. the first magnetic antenna or the second magnetic antenna].

In embodiments, the participant may be configured to vary an emission ratio of the antenna array by detuning the self-resonance of at least one of the two magnetic antennas [e.g. the first magnetic antenna or the second magnetic antenna].

In embodiments, the first magnetic antenna and the second magnetic antenna may be driven in a phase-shifted manner [e.g. by 90°].

In embodiments, the participant may be configured to divide a data packet [e.g. of the bit transfer layer] to be transferred onto a plurality of sub-data packets and to transmit the plurality of sub-data packets in a non-continuous manner [e.g. by using a time and/or frequency hopping pattern], wherein the participant may be configured to vary the radiation characteristic of the antenna array at least once between the emission of two sub-data packets.

For example, the participant may be configured to vary the radiation characteristic of the antenna array after each emitted sub-data packet or after a specified number of sub-data packets [e.g. by deactivating the respectively other magnetic antenna of the antenna array].

In embodiments, the participant may be configured to divide a data packet [e.g. of the bit transfer layer] to be transferred onto a plurality of sub-data packets and to transmit the plurality of sub-data packets in an non-continuous manner by using a frequency hopping pattern [e.g. and a time hopping pattern], wherein the resonant frequencies of the first magnetic antenna and the second magnetic antenna may be slightly detuned on purpose so that in the emission of the plurality of sub-data packets a radiation characteristic [e.g. an emission direction; e.g. a main lobe] of the antenna array varies contingent on the frequencies defined by the frequency hopping pattern.

For example, the resonant frequency of the first magnetic antenna and/or the second magnetic antenna may be detuned in a range that corresponds to the reciprocal Q factor. With a Q factor of Q=100, the detuning may be carried out in a window of not more than +/−1%, since hardly any power comes out in case of an even stronger detuning.

In embodiments, the antenna array may comprise a tuning means (or device, or unit) for tuning the magnetic antenna, wherein the antenna array is configured to automatically tune the antenna.

In embodiments, the antenna array may further comprise an electric antenna.

In embodiments, the transmission and/or reception means may be a transmission means (or device, or unit) [e.g. a transmitter], a reception means (or device, or unit) [e.g. a receiver] or a transmission/reception means [a transceiver].

In embodiments, the participant may be configured to communicate in the ISM band.

In embodiments, the participant may be a terminal point of the communication system.

In embodiments, the terminal point may be a sensor node or actuator node.

In embodiments, the terminal point may be battery-operated.

In embodiments, the terminal point may comprise an energy harvesting element for the generation of electric energy.

In embodiments, the participant may be a base station of the communication system.

Further embodiments provide a communication system with at least two of the participants described herein.

For example, the at least two participants may be one or several terminal points [e.g. a multitude of terminal points] and one or several base stations. Obviously, the at least two participants may also be at least two terminal points or base stations.

Further embodiments provide a method for operating a participant of a communication system, wherein the participant comprises an antenna array, wherein the antenna array comprises a magnetic antenna with a loop discontinued once or multiple times. The method includes a step of transmitting and/or receiving communication signals by using the magnetic antenna.

Embodiments of the present invention provide a participant [e.g. a terminal point] of a communication system with a magnetic antenna.

With the magnetic antenna addressed in the embodiments, (1) the installation size of participants of a communication system, e.g. of sensor nodes, may be decreased, (2) independence from the environment may be provided by the automatic tuning, and/or (3) emission/reception from (partially) electrically shielded environments may be possible (or improved).

BRIEF DESCRIPTION OF THE DRAWINGS

Embodiments of the present invention will be detailed subsequently referring to the appended drawings, in which:

FIG. 1c shows an antenna diagram of the magnetic antenna shown in FIG. 1a;

FIG. 3a shows a schematic view of a participant of a communication system according to an embodiment of the present invention.

DETAILED DESCRIPTION OF THE INVENTION

Figure 1A:
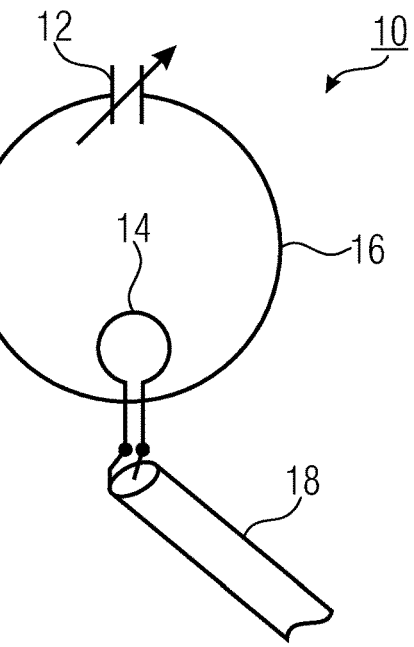
FIG. 1a shows a schematic view of a magnetic antenna that is tunable by hand by means of a variable high voltage capacitor.
Figure 1B:
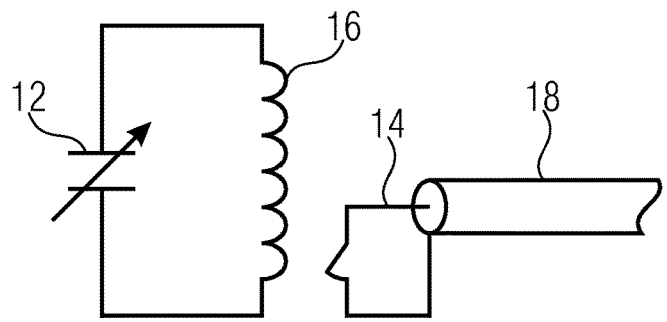
FIG. 1b shows an electric equivalent circuit diagram of the magnetic antenna shown in FIG. 1.
Figure 1C:
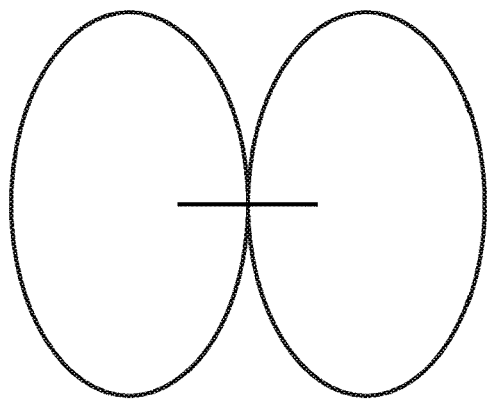
Figure 2:
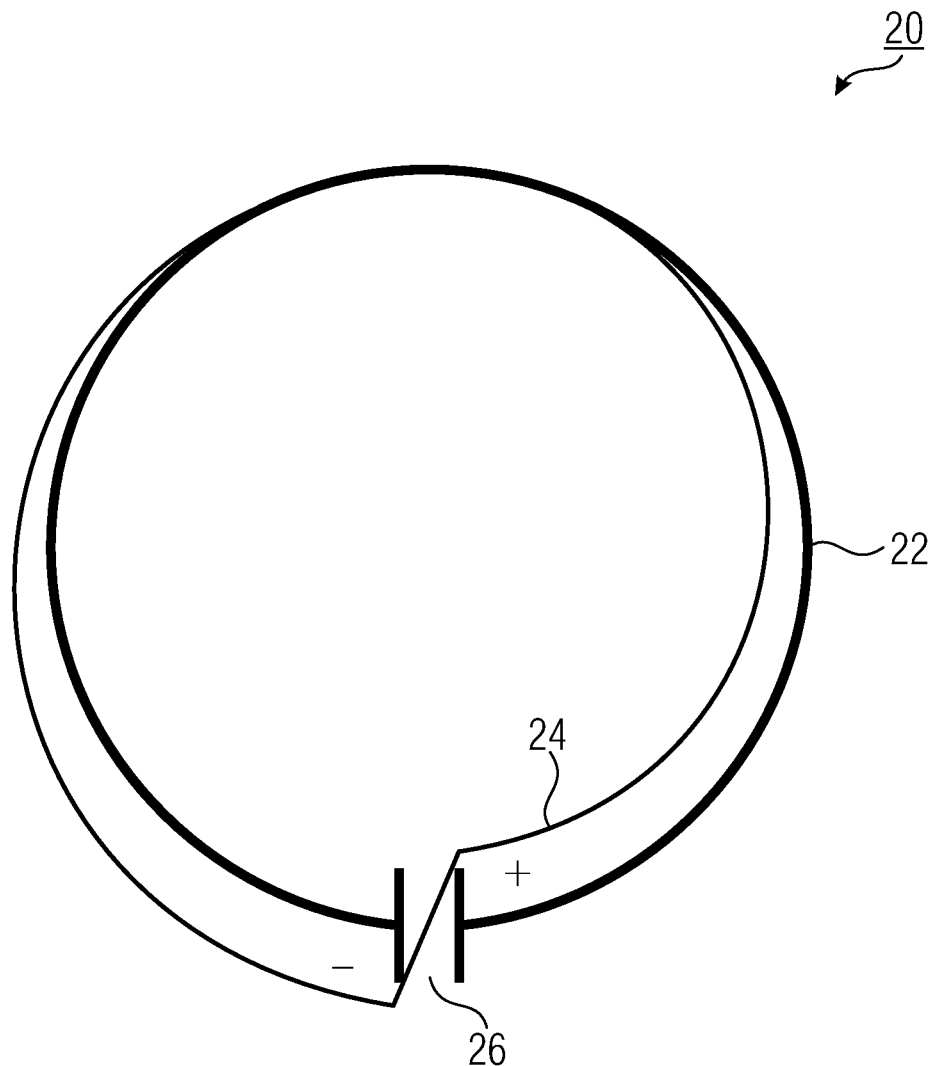
FIG. 2 shows a schematic view of a magnetic antenna and an electric field of the magnetic antenna.

In the subsequent description of the embodiments of the present invention, the same elements or elements having the same effect are provided in the drawings with the same reference numerals so that their description is interchangeable.

FIG. 3a shows a schematic view of a participant 100 of a communication system according to an embodiment of the present invention. The participant 100 includes a transmission and/or reception means 102 (e.g. a transmitter) and an antenna array 104 connected to the transmission and/or reception means 102, wherein the antenna array 104 comprises a magnetic antenna 106 with a loop 108 discontinued once (i.e. just one time).

Figure 3B:
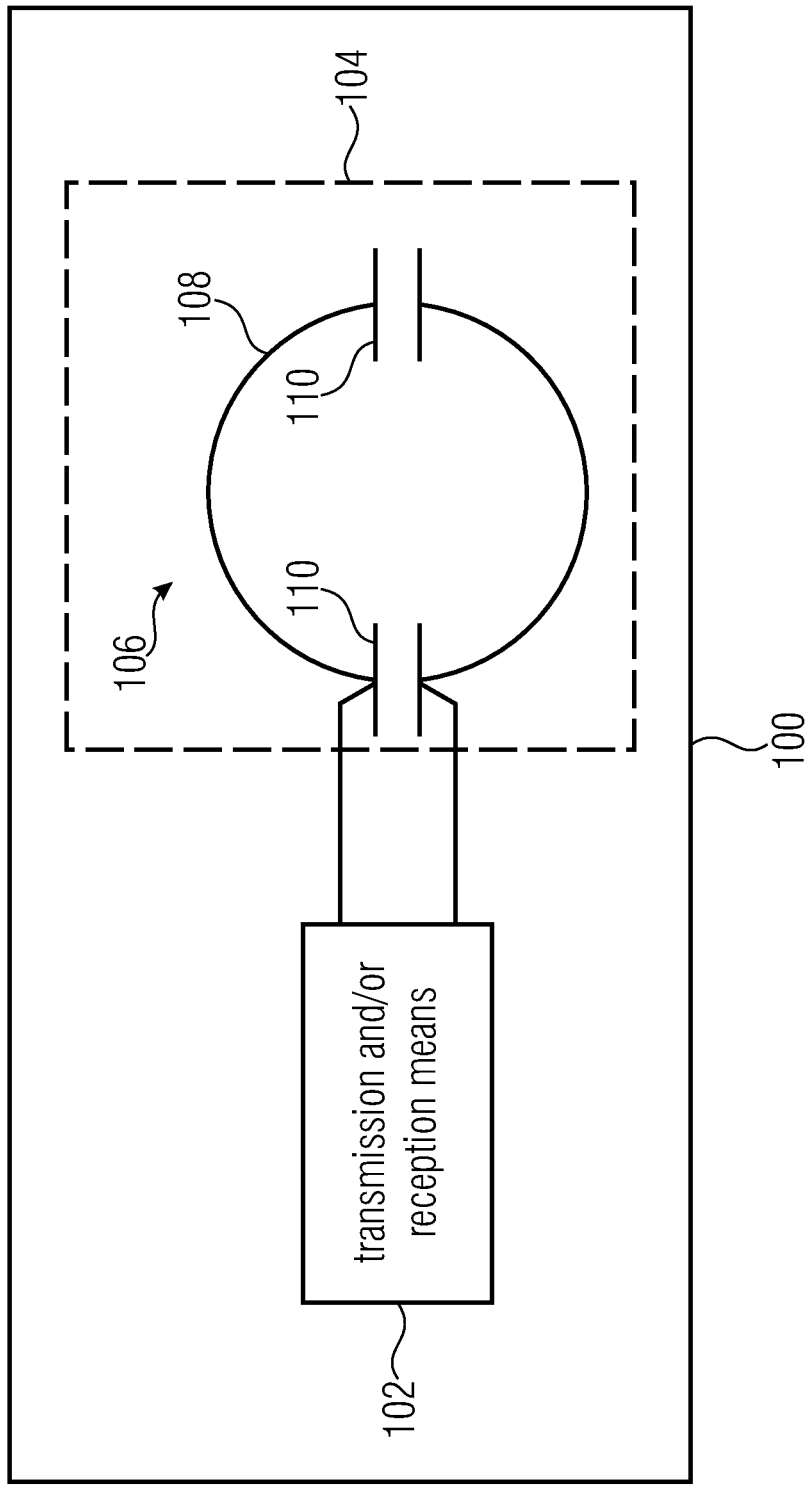
FIG. 3b shows a schematic view of a participant of a communication system according to an embodiment of the present invention.

FIG. 3b shows a schematic view of a participant 100 of a communication system according to an embodiment of the present invention. The participant 100 includes a transmission and/or reception means 102 (e.g. a transmitter) and an antenna array 104 connected to the transmission and/or reception means 102, wherein the antenna array 104 comprises a magnetic antenna 106 with a loop 108 discontinued multiple times.

The following primarily describes embodiments of the antenna array 104 with the magnetic antenna 106 with the loop discontinued multiple times shown in FIG. 3b. However, it is to be noted that the embodiments described in following may also be applied to the antenna array 104 with the magnetic antenna 106 with the loop discontinued once shown in FIG. 3.

In embodiments, the loop 108 with the magnetic antenna 106 may be discontinued by capacity elements 110, such as resonance capacities (resonance capacitors). For example, as is illustratively shown in FIG. 3b, the loop 108 of the magnetic antenna 106 may be discontinued (e.g. capacitively shortened) by two capacity elements 110. However, it is be noted, that the loop 108 of the magnetic antenna 106 may also be discontinued by any other number of capacity elements 110 in embodiments. Thus, in embodiments, the loop 108 of the magnetic antenna 106 may be divided by n capacity elements 110 into n segments (or parts, or portions) wherein n is a natural number larger than or equal to two. Segments are here the parts, or portions, of the loop between the respective capacity elements 110.

In embodiments, the segments of the loop 108 discontinued multiple times may be connected by the capacity elements 110. In detail, two segments of the loop discontinued multiple times may be connected by one capacity element connected in series between the two segments each. In other words, the segments of the loop 108 of the magnetic antenna 106 and the capacity elements 110 are alternatingly connected in series as a loop.

In this case, the transmission and/or reception means 102 may be connected to the magnetic antenna 106 via one of the capacity elements 110. The one capacity element on the one side and the loop 108 discontinued multiple times with the other (e.g. remaining) capacity elements on the other side may form a parallel resonance circuit (e.g. from the point of view of the transmission and/or reception means 102).

In embodiments, the antenna array 102 may further comprise a tuning means for tuning the magnetic antenna 106. The tuning means may be configured to automatically tune the magnetic antenna 106.

Contingent on the geometric shape of the loop 108 of the magnetic antenna 106, the radiation energy from the magnetic antenna 106 is not emitted uniformly in all directions of a plane. Rather, the antenna diagram of the magnetic antenna 106 shown in FIG. 3b comprises null, i.e. there are areas (e.g. points) in the antenna diagram where the radiation energy of the magnetic antenna is practically zero. In embodiments, the antenna array 104 may therefore comprise a second magnetic antenna, as is described on the basis of FIG. 7 in detail below, or also an additional electric antenna. The second magnetic antenna and/or the additional electric antenna may be arranged such that the nulls of the magnetic antenna 106 are compensated.

In embodiments, the participant 100 of the communication system may obviously not only be configured to transmit signals to other participants of the communication system by means of the magnetic antenna 106, but also to receive signals from other participants of the communication system by means of the magnetic antenna 106. To this end, the participant 100 may comprise a reception means (e.g. a receiver) connected to the antenna array 104, for example. Obviously, the participant 100 may also comprise a combined transmission/reception means (e.g. a transceiver) 102.

In embodiments, the participant 100 (or the communication system of the participant) may be configured to communicate in the ISM band (ISM=Industrial, Scientific and Medical band), i.e. to transmit and/or to receive signals in the ISM band.

In embodiments, the participant 100 (e.g. the communication system of the participant) may be configured to transmit data on the basis of the telegram splitting method. In the telegram splitting method, data, such as a telegram or data packet, is divided into a plurality of sub-data packets (or partial data packets or partial packets) and the sub-data packets are transferred distributed in time and/or in frequency (i.e. not continuously) from one participant to another participant (e.g. from the base station to the terminal point or from the terminal point to the base station) of the communication system by using a time and/or frequency hopping pattern, wherein the participant receiving the sub-data packets joins (or combines) them so as to obtain the data packet. In this case, each of the sub-data packets contains only a part of the data packet. Furthermore, the data packet may be channel-encoded so that not all sub-data packets are a requirement to faultlessly decode the data packet, but only a part of the sub-data packets.

In embodiments, the communication system may be a personal area network (PAN) or a low power wide area network (LPWAN).

The participant 100 of the communication system shown in FIG. 3b may be a base station of the communication system. Alternatively, the participant 100 of the communication system shown in FIG. 3b may also be a terminal point of the communication system, as is subsequently described on the basis of FIG. 3c.

Figure 3C:
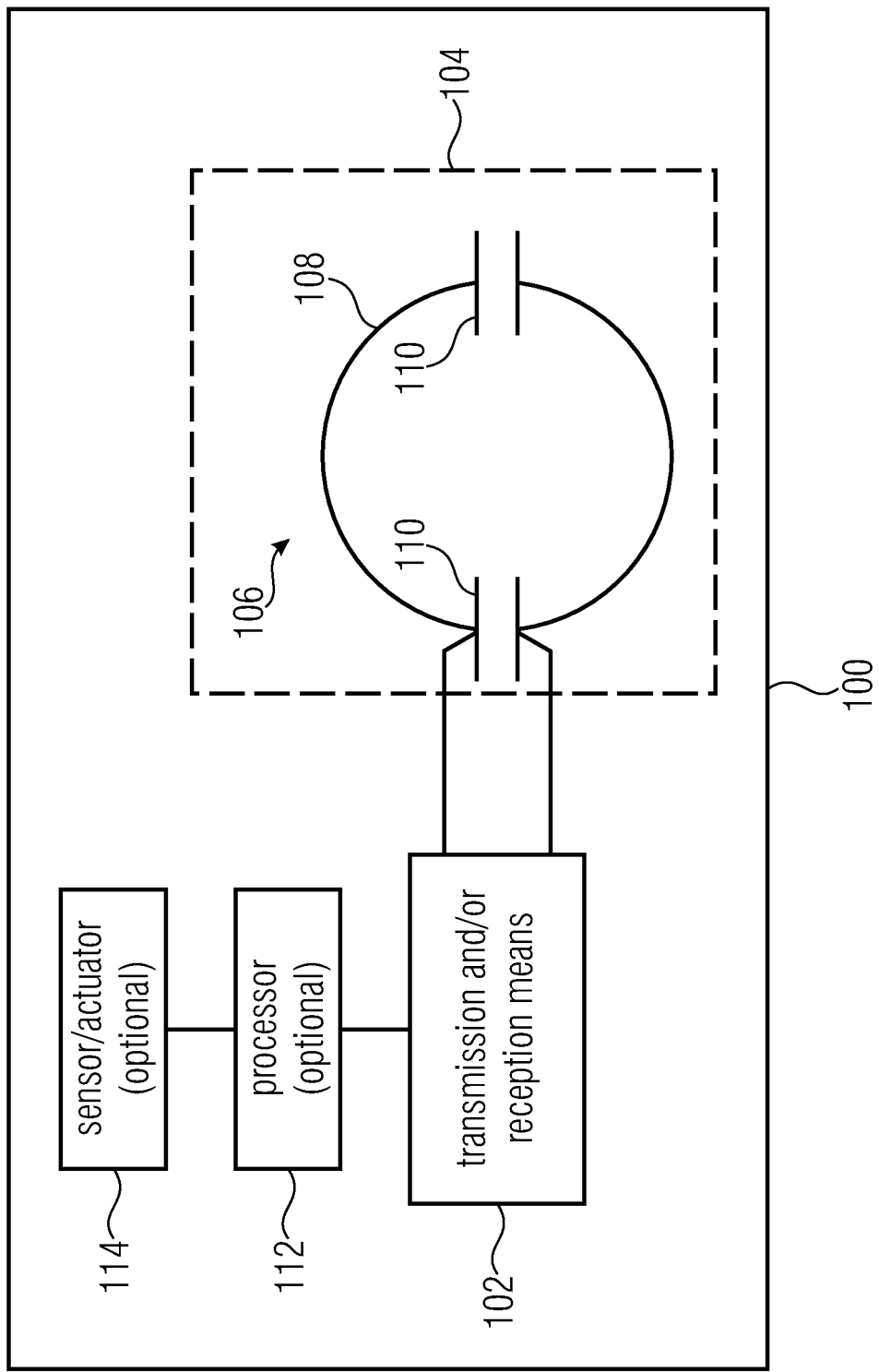
FIG. 3c shows a schematic view of a terminal point of a communication system according to an embodiment of the present invention.

In detail, FIG. 3c shows a schematic view of a participant of 100 of the communication system, wherein the participant 100 is a terminal point, according to an embodiment of the present invention.

As is exemplarily shown in FIG. 3c, the terminal point 100 may be as sensor node in embodiments. In the case of a sensor node, the terminal point 100 may be a sensor 114, such as a temperature sensor, a pressure sensor, a humidity sensor, or any other sensor, wherein the signals transmitted by the sensor node 100 depend on a sensor signal provided by the sensor. For example, the sensor may comprise a microprocessor 112 that processes the sensor signal provided by the sensor so as to generate, on the basis of the sensor signal, data to be transferred that is transmitted by the transmission means (e.g. transmission and receptions means) 102, e.g. on the basis of the telegram splitting transfer method.

Obviously, the terminal point 100 may also be an actuator node, wherein the actuator node comprises an actuator 114. In this case, for example, the processor 112 may be configured to drive the actuator 114 on the basis of the received signal, or the received data.

In embodiments, the terminal point 100 may be battery operated. Alternatively or additionally, the terminal point 100 may comprise an energy harvesting element for the generation of electric energy.

In the following, detailed embodiments of the magnetic antenna 106, or the antenna array 104 with the magnetic antenna 106, are described.

1. Design of the Loop

Embodiments concern magnetic antennas (e.g. for sensor nodes or also for base stations) for the transmission and/or reception case. In this case, the magnetic antennas may be tuned automatically.

1.1. Application of Magnetic Antennas in Sensor Nodes

A magnetic antenna 106 comprises a current loop 108 with one or several turns. In the reception case, an alternating magnetic field induces a voltage in the loop 108 (induction law, [5]), in the transmission case, a current flowing in the loop 108 generates a magnetic field (law of Biot-Savart [6]). If the magnetic antenna 106 is to be operated only at a frequency or in a range of a small relative bandwidth, the magnetic antenna 106 the efficiency of the magnetic antenna may be significantly increased by means of a resonance capacity. The current flow 108 increases to the extent of the resonance rise (expressed by the quality factor Q) i.e. twice the Q factor causes twice the current flow (and therefore twice the magnet field) at the same power fed. Thus, it is desirable to achieve as high a Q factor as possible, which at the same time means that the loop 108 and the capacity have to have the smallest possible losses. Usually, the losses in the loop 108 predominate due to the finite conductivity of the metal used (mostly Cu).

Figure 4:
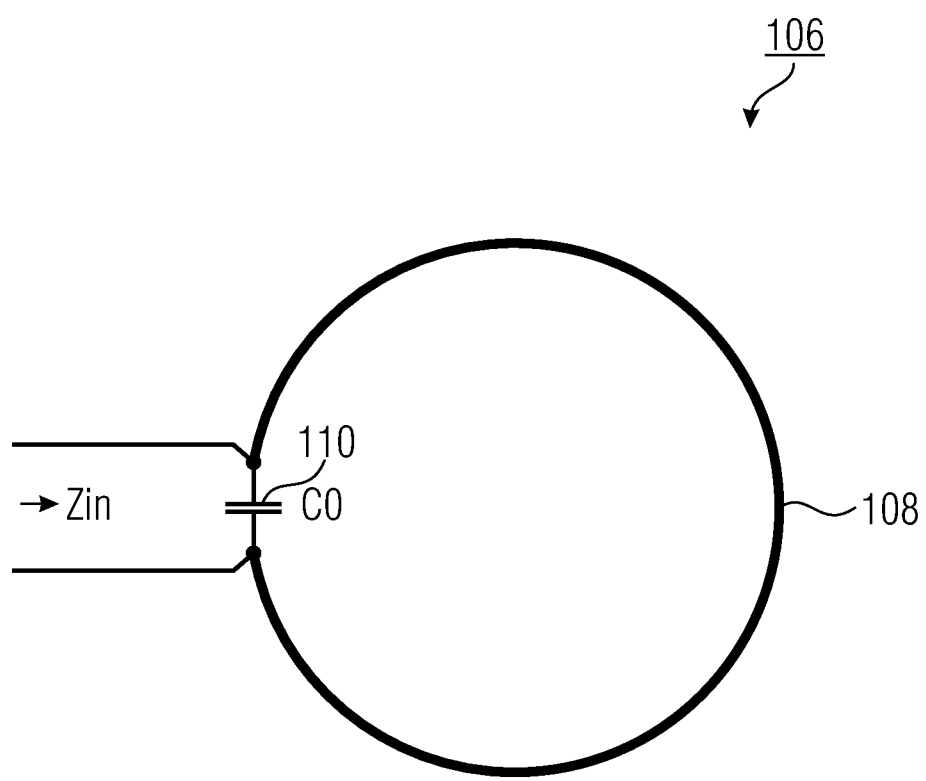
FIG. 4 shows a schematic view of a magnetic antenna.

FIG. 4 shows a schematic view of such a magnetic antenna 106. As already mentioned, the magnetic antenna 106 comprises the loop 108 with one or several turns, and the resonance capacity 110 (C0). In this case, the magnetic antenna 106 may be coupled in, e.g. to the transmission and/or reception means 102, via the parallel resonance circuit formed by the resonance capacity 110 and the loop 108 (coil) (c.f. FIG. 3).

The magnetic antenna 106 has the advantage of a high antenna Q factor while at the same time having a small installation size.

In addition, the magnetic antenna 106 has the advantage that it may be adapted to different environment conditions, e.g. by automatic tuning.

Embodiments of the present invention concern a sensor node with a magnetic antenna. In this case, the magnetic antenna may be automatically tuned.

1.2. Multiple Shortening of the Loop of the Magnetic Antenna

Figure 5:
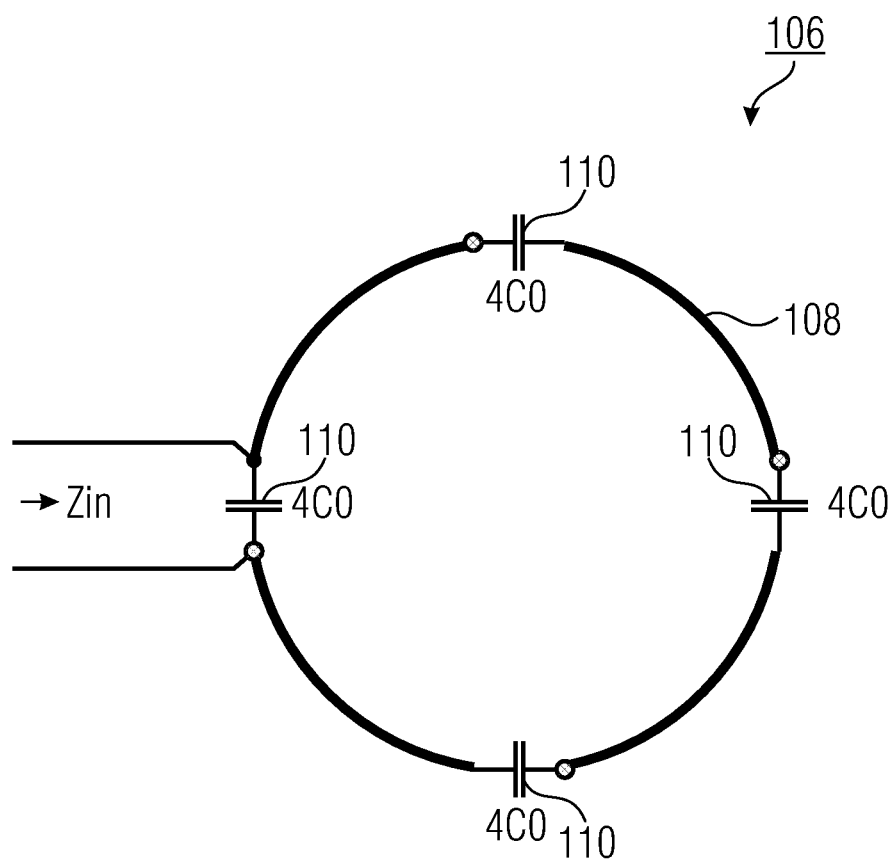
FIG. 5 shows a schematic view of a magnetic antenna with a (e.g. capacitively shortened) loop discontinued multiple times according to an embodiment of the present invention.

FIG. 5 shows a schematic view of a magnetic antenna 106 with a (e.g. capacitively shortened) loop 108 discontinued multiple time. As is exemplarily shown in FIG. 5, the loop 108 may be divided into four segments by four capacity elements 110 (4C0), e.g. resonance capacities (e.g. resonance capacitors). However, it is to be noted that the loop 108 of the magnetic antenna 106 may also be divided in any other number of segments. Thus, in embodiments, the loop 108 of the magnetic antenna 106 may be divided into n segments by n capacity elements 110, wherein n is a natural number larger than or equal to two.

In embodiments, the loop 108 of the magnetic antenna may be divided into equidistant segments. Dividing the loop 108 into equidistant segments has the advantage that the lowest electric field portions are achieved overall. Obviously, the loop may also be divided into non-equidistant segments.

The lower electric fields, or the multiple capacitive shortening, have the advantage that dielectric material in the direct vicinity of the antenna detunes the same less in its resonance frequency accordingly.

In addition, the lower electric fields, or the multi-capacitive shortening, have the advantage that dielectric lossy material in the direct vicinity of the antenna reduces its Q factor less.

In addition, the lower electric fields, or the multi-capacitive shortening, have the advantage that the voltage at the resonance capacities is accordingly lower (i.e., e.g. half the voltage at twice the shortening, however, twice the capacity value). In particular, this is of advantage if one or several of the resonance capacities are to be tunable, since the tuning organs may then comprise a lower voltage sustaining capability/electric strength.

In embodiments, the magnetic antenna 106 (or the loop 108 of the magnetic antenna 106) may be capacitively shortened multiple time.

In embodiments, there are several capacitors 110 arranged in series in the magnetic loop.

1.3. Particular Design of the Loop of the Magnetic Antenna

Loops 108 with a round shape have the best ratio of conductor path length to spanned (or enclosed) surface area. However, the use of space on a conventionally rectangular circuit board (conductive paths) is not optimal.

Figure 6:
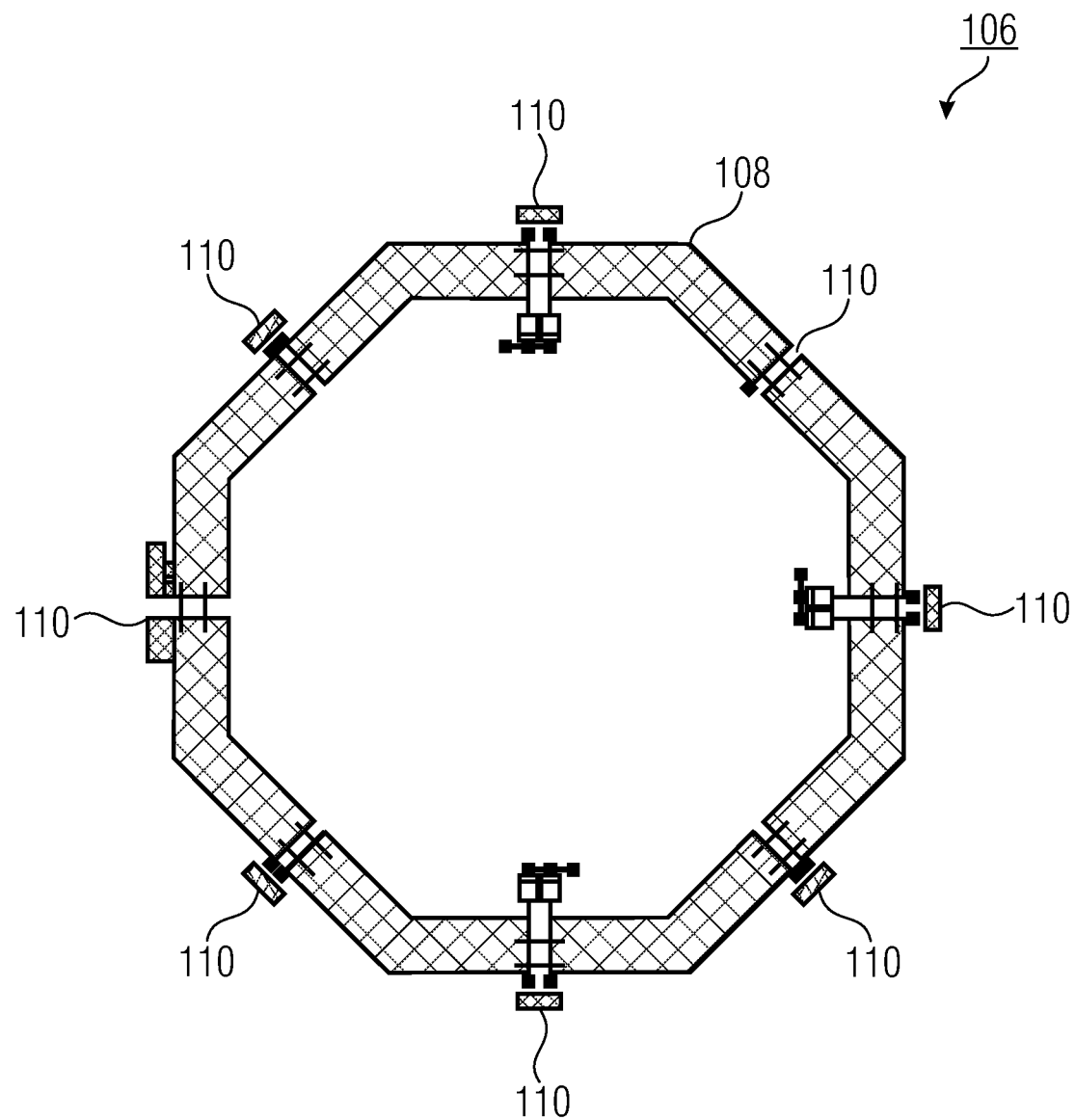
FIG. 6 shows a schematic view of a magnetic antenna with a loop discontinued multiple times, wherein the loop is octagonal, according to an embodiment of the present invention.

Shapes with more than four corners, in particular the octagonal shape, have advantages. One the one hand, the ratio of surface area to circumference worsens and therefore also the Q factor of the magnetic antenna 106, however, the efficiency of the magnetic antenna 106 increases with a given rectangular circuit board surface area, since the spanned (or enclosed) surface area becomes larger. FIG. 6 shows a symmetrical design (of the loop 108) of the magnetic antenna 106, however, non-symmetrical designs (of the loop 108) would be conceivable, in which, e.g., the upper and lower partial pieces (e.g. segments of the loop 108) are longer.

In detail, FIG. 6 shows a schematic view of a magnetic antenna 106 with a loop 108 discontinued multiple times, wherein the loop 108 has an octagonal shape.

As is exemplarily shown in FIG. 6, the loop 108 may be divided into eight segments by (e.g. eight) capacity elements 110, wherein the eight segments may be angular so that the loop 108 comprises an octagonal shape. However, it is to be noted that the loop 108 may also be divided into any other number of segments and/or may comprise any other shape. Thus, the loop 108 of the magnetic antenna may be m-gonal, wherein m is any natural number of larger than or equal to four, e.g. 4, 5, 7, 8, 9, 10, 11 or 12.

In embodiments, the magnetic antenna 106 may be implemented on a printed circuit board (PCB).

In embodiments, the magnetic antenna 106 (or the loop 108 of the magnetic antenna 106) may comprise partial portions (or segments) that are not round.

In embodiments, a lead routing of the segments of the magnetic antenna 106 (or the loop 108 of the magnetic antenna 106) may be straight in the areas (or at the location) with components.

In embodiments, the magnetic antenna 106 (or the loop 108 of the magnetic antenna 106) may have a polygonal shape or may comprise more than four corners.

Such a magnetic antenna 106 has the advantage that the layout may be transferred more easily to different layout programs.

In addition, such a magnetic antenna 106 has the advantage that placement of the components is easier since the lead routing (of the loop 108 of the magnetic antenna 106) is straight at the locations with the components.

In some embodiments, the sides extending diagonally (segments of the loop 108 of the magnetic antenna 106) may comprise a circular arc shape instead of an angular shape, so as to further increase the surface area and to achieve optimum use of the circuit board surface area. In reaction thereto, one would lose the advantages of the easier component placement and the simpler layout.

Although the antenna array 104 shown in FIG. 6 comprises a magnetic antenna 106 with a loop 108 discontinued multiple times, it is to be noted that the embodiments described may also be applied to an antenna array 104 with a magnetic antenna 106 with a loop 108 discontinued once (c.f. FIG. 3a).

1.4. The Loop is Realized on a Circuit Board

In embodiments, the loop may be realized on a printed circuit board (PCB). In embodiments, the tuning circuit may be realized on the same circuit board.

2. Several Antennas

In embodiments, the antenna array 104 may comprise several magnetic antennas.

This has the advantage that the null (e.g. points in the antenna diagram where the radiation energy of the magnetic antenna is practically zero) of a magnetic antenna may be circumvented.

2.1. Cross Field Loop with Diversity

In embodiments, two magnetic antennas may be used, the two magnetic antennas being (e.g. essentially) as orthogonal as possible.

2.2. Flat Second Loop to Avoid Null

In order to obtain as flat a housing as possible, the second magnetic antenna (or the loop of the second magnetic antenna) may be designed to be "flattened". In the case of loops that are not round, the resistance of the winding increases compared to the spanned (or enclosed) surface area, decreasing the Q factor. In the case of a flattened loop, since a smaller surface area is spanned, it's radiation efficiency decreases. On the one hand, this slightly increases the Q factor, on the other hand, it does not contribute to the radiation. In order to at least partially compensate the first Q factor-reducing effect, a broader conductor (less losses) may be used.

Figure 7:
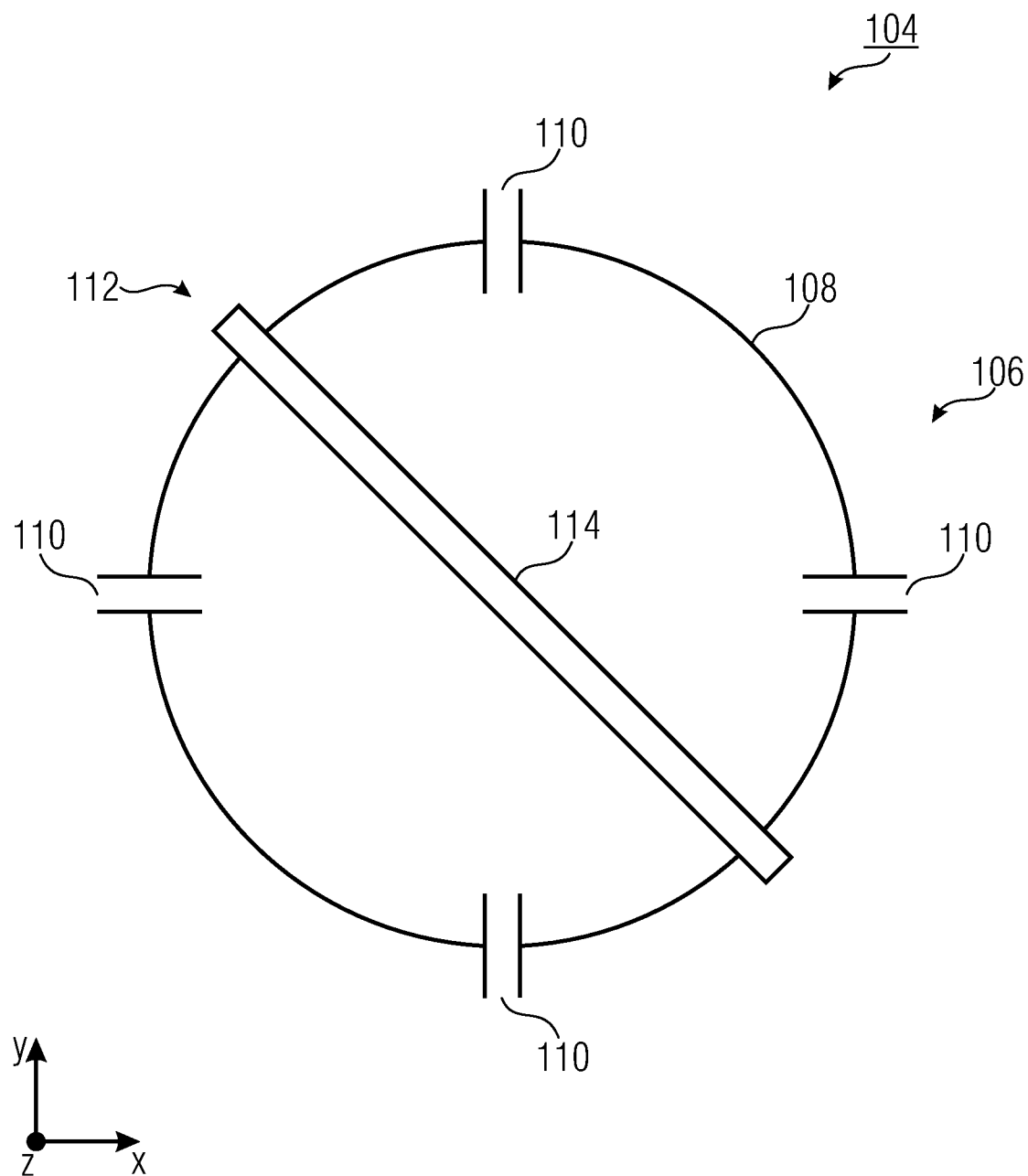
FIG. 7 shows a schematic view of an antenna array with a first magnetic antenna and a second magnetic antenna according to an embodiment of the present invention.

FIG. 7 shows a schematic view of an antenna array 104 with a first magnetic antenna 106 and second magnetic antenna 112 according to an embodiment of the present invention.

The first magnetic antenna 106 includes a loop 108 discontinued multiple times. As is exemplarily shown in FIG. 7, the loop 108 of the first magnetic antenna may be divided into four segments by four capacity elements 110. However, it is to be noted that the loop 108 of the first magnetic antenna 106 may also be divided into any other number of segments. Thus, in embodiments, the loop 108 of the first magnetic antenna 106 may be divided into n segments by n capacity elements 110, wherein n is a natural number of larger than or equal to two.

The second magnetic antenna 112 also includes a loop 114, wherein the loop 108 of the first magnetic antenna 106 and the loop 114 of the second antenna 112 may be arranged essentially orthogonal to each other.

As is exemplarily shown in FIG. 7, a surface area spanned by the loop 114 of the second magnetic antenna 112 extends orthogonally to a surfaced area spanned by the loop 108 of the first magnetic antenna 106. In detail, in FIG. 7, the surface area spanned by the loop 108 of the first magnetic antenna 106 extends in parallel to the xy-plane defined by the coordinate system, whereas the surface area spanned by the loop 114 of the second magnetic antenna 112 extends in parallel to the z-axis of the coordinate system.

In embodiments, a surface area spanned (or enclosed) by the loop 114 of the magnetic antenna 112 may be smaller than a surface area spanned (or enclosed) by the loop 108 of the first magnetic antenna 106 by the factor two (e.g. by the factor three, four, five, or ten).

In other words, the loop 114 of the second magnetic antenna 112 may be "flattened".

As is further indicated in FIG. 7, in embodiments, a conductor of the loop 114 of the second magnetic antenna 112 may be thicker, or broader, than a conductor of the loop 108 of the first magnetic antenna 106 at least by the factor two (e.g. by the factor three, four, or five).

Obviously, the loop 114 of the second magnetic antenna 112 may also be discontinued multiple times, e.g. by at least two capacity elements.

In embodiments, the antenna array 104 may comprise a second loop 114 which is as orthogonal as possible.

In embodiments, a wire size/width of the second loop 114 may be larger (than a wire size/width of the first loop 108), however, the second loop 114 may be flatter (than the first loop 108).

Although the antenna array 104 shown in FIG. 7 comprises magnetic antennas with loops discontinued multiple times, it is to be noted that the described embodiments may also be applied to an antenna array with magnetic antennas with loops discontinued once.

2.3. Combined Magnetic/Electric Antenna to Avoid Nulls

In order to circumvent the null (e.g. points in the antenna diagram where the radiation energy of the magnetic antenna is practically zero) of the magnetic antenna 106, an electric antenna may be integrated on the printed circuit board (e.g. PCB) in addition to the magnetic antenna 106, e.g. in the form of a PCB F antenna, as an "extension" of the loop 108 (e.g. of the magnetic ring/8-gon).

In embodiments, an electric and an magnetic antenna may be combined (e.g. on a printed circuit board (e.g. PCB)).

2.4. Switching the Loops

If several magnetic loops (or magnetic antennas) are connected together, a new null from a different direction arises.

Thus, the use of several magnetic loops (or several magnetic antennas) only makes sense if the unused loop(s) (or magnetic antenna(s)) may be switched off.

2.4.1. Switching Off by Discontinuation of the Resonance Current

In embodiments, the current flow of the undesired magnetic antenna may be interrupted by means of a switch, for example. However, since each switch comprises a certain residual capacity, this essentially corresponds to a strong detuning of the resonance frequency.

2.4.2. Switching Off by Means of Additional Inductivity (L)

In embodiments, one or several resonance capacitors may be provided in parallel with a coil. At the original resonance frequency of the loop, they form a parallel resonance circuit that interrupts the current flow therein.

2.4.3. Changing the Drive Ratio

In embodiments, the tuning of the loops and therefore the main emission direction and therefore the null may be shifted by a slight detuning of the self-resonance of one of the two loops, since the loops then emit with a different power at the same high drive powers. The non-emitted portion of the slightly detuned loop is then reflected back and absorbed in the transmitter.

2.4.4. Phase-Shifted Drive of Magnetic Loops

The null of a loop depends on its structure in the three-dimensional space. This does not change, e.g., when varying the capacity of a resonance capacity only. Thus, in the case of planar loops, there is a position in which B-field lines do not penetrate the same, i.e. if they extend in the plane of the loop. However, even in the case of three-dimensional loop (or curved B-lines), i.e. in a slightly curved circular ring that does not extend exactly in a plane, one can find a position in which field lines penetrating from one side or from the other side of the loop are in balance. This leads to a compensation, i.e. a null. Even orthogonal loops would comprise a null under 45° if their signals are only connected directly. In order to avoid this, their reception signals may be combined under a phase-offset of 90° since this makes impossible a geometrical cancellation of the temporal signals.

In embodiments, several magnetic loops may be driven in a phase-shifted manner.

In embodiments, several self-tuned magnetic loops may be driven in a phase-shifted manner.

2.5. Variation of the Radiation Ratio via the Hop Number

In connection with the telegram splitting transfer method [7], a transmission diversity (i.e. emission with different antennas) may be performed per telegram, since the emission of each sub-data packet (hop) on a different antenna/ with a different strength on the antennas is possible in the telegram splitting transfer method.

This has the advantage that the transfer reliability of a telegram may be increased.

In embodiments, different sub-data packets (hops) may be emitted with a different intensity on different antennas so that different sub-data packets are transmitted with different antenna nulls.

2.5.1. Design of the Loop in which the Null Depends on the Frequency

Embodiments may use more or less orthogonal loops with a different resonance frequency whose signals are combined via a decoupled combiner. If the resonance frequencies are close together, the loops already have to comprise a good geometrical orthogonality (i.e. magnetic decoupling). Otherwise, there is a loss of Q factor and resonance distortions. Thus, the resonance frequency is slightly detuned on purpose. Different sub-data packets (hops) are on different frequencies and are therefore emitted with different intensities and with different resonances by the loops, thus, the null of the magnetic antenna is respectively shifted.

In embodiments, the emission ratio of the magnetic antennas varies across the frequency.

In embodiments, the null of the antenna shifts across the frequency.

3. Further Embodiments

Figure 8:
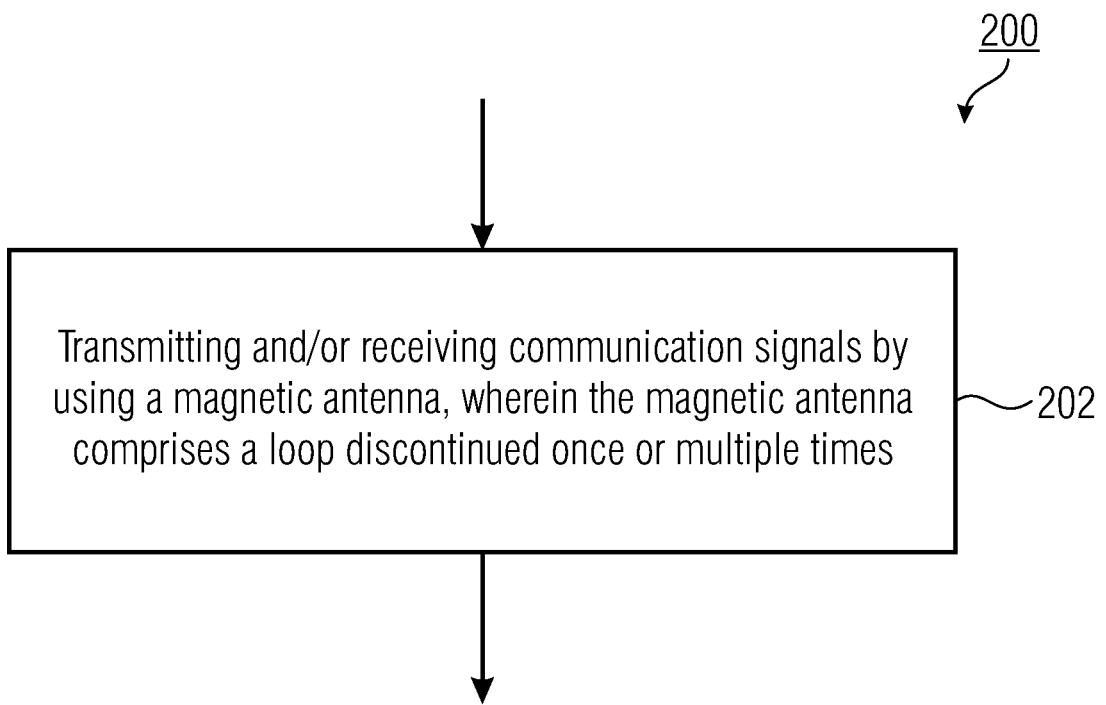
FIG. 8 shows a flow diagram of a method for operating a participant of a communication system according to an embodiment of the present invention.

FIG. 8 shows a flow diagram of a method 200 for operating a participant of a communication system according to an embodiment of the present invention. The method at 200 includes a step 202 of transmitting and/or receiving of communication signals by using a magnetic antenna of an antenna array of the participant of the communication system, wherein the magnetic antenna comprises a loop discontinued once or multiple times.

Embodiments of the present invention provide (e.g. self-tuning) magnetic antennas, e.g. for sensor nodes. With the IoT, the internet of things, the number of the wirelessly communicating sensor nodes increases. In this case, there are ever stronger requirements with respect to a small form factor and a simple handling capability. These requirements may be fulfilled only to a small extent with the existing electric antennas. Embodiments of the present invention enable the use of magnetic antennas and sensor nodes and therefore fulfill the above-mentioned requirements.

Even though some aspects have been described within the context of a device, it is understood that said aspects also represent a description of the corresponding method, so that a block or a structural component of a device is also to be understood as a corresponding method step or as a feature of a method step. By analogy therewith, aspects that have been described within the context of or as a method step also represent a description of a corresponding block or detail or feature of a corresponding device. Some or all of the method steps may be performed while using a hardware device, such as a microprocessor, a programmable computer or an electronic circuit. In some embodiments, some or several of the most important method steps may be performed by such a device.

Depending on specific implementation requirements, embodiments of the invention may be implemented in hardware or in software. Implementation may be effected while using a digital storage medium, for example a floppy disc, a DVD, a Blu-ray disc, a CD, a ROM, a PROM, an EPROM, an EEPROM or a FLASH memory, a hard disc or any other magnetic or optical memory which has electronically readable control signals stored thereon which may cooperate, or cooperate, with a programmable computer system such that the respective method is performed. This is why the digital storage medium may be computer-readable.

Some embodiments in accordance with the invention thus comprise a data carrier which comprises electronically readable control signals that are capable of cooperating with a programmable computer system such that any of the methods described herein is performed.

Generally, embodiments of the present invention may be implemented as a computer program product having a program code, the program code being effective to perform any of the methods when the computer program product runs on a computer.

The program code may also be stored on a machine-readable carrier, for example.

Other embodiments include the computer program for performing any of the methods described herein, said computer program being stored on a machine-readable carrier.

In other words, an embodiment of the inventive method thus is a computer program which has a program code for performing any of the methods described herein, when the computer program runs on a computer.

A further embodiment of the inventive methods thus is a data carrier (or a digital storage medium or a computer-readable medium) on which the computer program for performing any of the methods described herein is recorded. The data carrier, the digital storage medium, or the recorded medium are typically tangible, or non-volatile.

A further embodiment of the inventive method thus is a data stream or a sequence of signals representing the computer program for performing any of the methods described herein. The data stream or the sequence of signals may be configured, for example, to be transmitted via a data communication link, for example via the internet.

A further embodiment includes a processing unit, for example a computer or a programmable logic device, configured or adapted to perform any of the methods described herein.

A further embodiment includes a computer on which the computer program for performing any of the methods described herein is installed.

A further embodiment in accordance with the invention includes a device or a system configured to transmit a computer program for performing at least one of the methods described herein to a receiver. The transmission may be electronic or optical, for example. The receiver may be a computer, a mobile device, a memory device or a similar device, for example. The device or the system may include a file server for transmitting the computer program to the receiver, for example.

In some embodiments, a programmable logic device (for example a field-programmable gate array, an FPGA) may be used for performing some or all of the functionalities of the methods described herein. In some embodiments, a field-programmable gate array may cooperate with a microprocessor to perform any of the methods described herein. Generally, the methods are performed, in some embodiments, by any hardware device. Said hardware device may be any universally applicable hardware such as a computer processor (CPU), or may be a hardware specific to the method, such as an ASIC.

For example, the apparatuses described herein may be implemented using a hardware device, or using a computer, or using a combination of a hardware device and a computer.

The apparatuses described herein, or any components of the apparatuses described herein, may at least be partially implement in hardware and/or software (computer program).

For example, the methods described herein may be implemented using a hardware device, or using a computer, or using a combination of a hardware device and a computer.

The methods described herein, or any components of the methods described herein, may at least be partially implement by performed and/or software (computer program).

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

BIBLIOGRAPHY

[1] https://amrron.com/2015/07/24/home-made-high-power-magnetic-loop-antennas/
[2] http://www.aa5tb.com/loop.html
[3] http://bio.groups.et.byu.net/SurfaceCoil_build.phtml
[4] https://onlinelibrary.wiley.com/doi/pdf/10.1002/mrm.1910160203
[5] https://de.wikipedia.org/wiki/Elektromagnetische_Induktion
[6] https://de.wikipedia.org/wiki/Biot-Savart-Gesetz
[7] DE 10 2011 082 098 B4

What is claimed is:

1. Participant of a wireless communication system,
wherein the participant comprises a transmission and/or reception unit and an antenna array connected to the transmission and/or reception unit,
wherein the antenna array comprises a magnetic antenna with a loop discontinued multiple times;
wherein the participant is configured to transmit signals to other participants of the communication system by means of the magnetic antenna, and/or to receive signals from other participants of the communication system by means of the magnetic antenna,
wherein the wireless communication system is a low power wide area network, LPWAN,
wherein the participant is configured to divide a data packet to be transferred onto a plurality of sub-data packets and to transmit the plurality of sub-data packets in a non-continuous manner by using a frequency-hopping pattern.

2. Participant according to claim 1,
wherein the participant is configured to transmit and/or receive signals to/from other participants of the communication system by means of the magnetic antenna.

3. Participant according to claim 1,
wherein the loop is discontinued by one or several capacity elements.

4. Participant according to claim 3,
wherein the loop discontinued multiple times is discontinued into at least two segments by the capacity elements.

5. Participant according to claim 1,
wherein the loop forms a coil.

6. Participant according to claim 3,
wherein the transmission and/or reception unit is connected to the magnetic antenna via one of the capacity elements.

7. Participant according to claim 1,
wherein the loop is ring-shaped or m-polygonal, wherein m is a natural number larger than or equal to four.

8. Participant according claim 1,
wherein the magnetic antenna is implemented on a circuit board.

9. Participant according to claim 1,
wherein the magnetic antenna is a first magnetic antenna,
wherein the antenna array further comprises a second magnetic antenna,
wherein the loop discontinued multiple times of the first magnetic antenna and a loop of the second magnetic antenna are arranged essentially orthogonal to each other.

10. Participant according to claim 9,
wherein a conductor of the loop of the second magnetic antenna is thicker or broader than a conductor of the loop of the first magnetic antenna at least by the factor two.

11. Participant according to claim 9,
wherein the participant is configured to deactivate one of the magnetic antennas of the antenna array to vary a radiation characteristic of the antenna array.

12. Participant according to claim 9,
wherein a participant is configured to vary an emission ratio of the antenna array by detuning the self-resonance of at least one of the two magnetic antennas.

13. Participant according to claim 11,
wherein the participant is configured to divide a data packet to be transferred onto a plurality of sub-data packets and to transmit the plurality of sub-data packets in a non-continuous manner,
wherein the participant is configured to vary the radiation characteristic of the antenna array at least once between the emission of two sub-data packets.

14. Participant according to claim 9,
wherein the participant is configured to divide a data packet to be transferred onto a plurality of sub-data packets and to transmit the plurality of sub-data packets in a non-continuous manner by using a frequency-hopping pattern,
wherein the resonance frequencies of the first magnetic antenna and the second magnetic antenna are slightly detuned on purpose so that in the emission of the plurality of sub-data packets a radiation characteristic of the antenna array varies contingent on the frequencies defined by the frequency hopping pattern.

15. Participant according to claim 1,
wherein the antenna array comprises a tuning unit for tuning the magnetic antenna,
wherein the antenna array is configured to automatically tune the magnetic antenna.

16. Participant according to claim 1,
wherein the participant is configured to communicate in the ISM band, where ISM stands for Industrial, Scientific and Medical.

17. Participant according to claim 1,
wherein the participant is a terminal point of the communication system.

18. Participant according to claim 1,
wherein the participant is a base station of the communication system.

19. Participant of a wireless communication system,
wherein the participant comprises a transmission and/or reception unit and an antenna array connected to the transmission and/or reception unit,
wherein the antenna array comprises a magnetic antenna with a loop discontinued once or multiple times,
wherein the magnetic antenna is a first magnetic antenna, wherein the antenna array further comprises a second magnetic antenna, wherein the loop discontinued once or multiple times of the first magnetic antenna and a loop of the second magnetic antenna are arranged essentially orthogonal to each other, and wherein the participant is configured to deactivate one of the magnetic antennas of the antenna array to vary a radiation characteristic of the antenna array, wherein the participant is configured to divide a data packet to be transferred onto a plurality of sub-data packets and to transmit the plurality of sub-data packets in a non-continuous manner by using a frequency-hopping pattern.

20. Participant of a wireless communication system, wherein the participant comprises a transmission and/or reception unit and an antenna array connected to the transmission and/or reception unit, wherein the antenna array comprises a magnetic antenna with a loop discontinued once or multiple times, wherein the magnetic antenna is a first magnetic antenna, wherein the antenna array further comprises a second magnetic antenna, wherein the loop discontinued once or multiple times of the first magnetic antenna and a loop of the second magnetic antenna are arranged essentially orthogonal to each other, wherein a participant is configured to vary an emission ratio of the antenna array by detuning the self-resonance of at least one of the two magnetic antennas.

* * * * *